(12) United States Patent
Chang

(10) Patent No.: US 7,897,991 B2
(45) Date of Patent: Mar. 1, 2011

(54) LIGHT EMITTING DIODE AND LED CHIP THEREOF

(75) Inventor: Chia-Shou Chang, Taipei Hsien (TW)

(73) Assignee: Foxconn Technology Co., Ltd., Tucheng, Taipei County (TW)

( * ) Notice: Subject to any disclaimer, the term of this patent is extended or adjusted under 35 U.S.C. 154(b) by 176 days.

(21) Appl. No.: 12/331,393

(22) Filed: Dec. 9, 2008

(65) Prior Publication Data

US 2010/0102339 A1    Apr. 29, 2010

(30) Foreign Application Priority Data

Oct. 27, 2008    (CN) .......................... 2008 1 0305235

(51) Int. Cl.
*H01L 33/00*    (2010.01)
(52) U.S. Cl. .......................... 257/99; 257/712; 257/774; 257/E33.056; 257/E33.062
(58) Field of Classification Search .................... 257/99, 257/712, 774, E33.056, E33.062
See application file for complete search history.

(56) References Cited

U.S. PATENT DOCUMENTS

2008/0303157 A1 * 12/2008 Cheng et al. ................. 257/758

* cited by examiner

*Primary Examiner*—Victor Mandala
(74) *Attorney, Agent, or Firm*—Frank R. Niranjan

(57) ABSTRACT

A light emitting diode includes a base, a first and second conductive members through the base and a light emitting diode chip on the base. The light emitting diode chip includes an upper surface, a bottom surface, a first sidewall and a second sidewall. The first sidewall and the second sidewall interconnect the upper surface and bottom surface. A first and second heat dissipating layers are respectively located on the first and second sidewalls. The first and second heat dissipating layers connect with the first and second conductive members, respectively. A bottom face of the chip electrically and thermally connects with the second conductive member. A gold wire electrically connects an electrode on a top face of the chip and the first heat dissipating layer.

11 Claims, 2 Drawing Sheets

LIGHT EMITTING DIODE AND LED CHIP THEREOF

BACKGROUND

1. Technical Field

The disclosure relates to light emitting diodes (LEDs), and more specifically to an LED chip of a light emitting diode (LED).

2. Description of Related Art

Presently, LEDs are preferred for use in non-emissive display devices than CCFLs (cold cathode fluorescent lamp) due to their high brightness, long lifespan, and wide color range.

A typical LED includes a base, an LED chip disposed on the base and an encapsulation material encapsulating the LED chip. The LED chip has two electrodes formed on top and bottom surfaces thereof for being electrically connected to outer electrodes on a bottom of the base. Heat generated by the LED chip only vertically transfers from the bottom surface of the LED chip to the base for dissipation. However, the LED chip is required to be more and more powerful while maintaining a smaller size. Therefore, the LED chip generates more heat and the small bottom surface of the LED chip can not efficiently transfer the heat generated by the LED chip to the base for dissipation.

Therefore, an LED is desired to overcome the above described shortcomings.

DETAILED DESCRIPTION OF THE INVENTION

Figure 1:
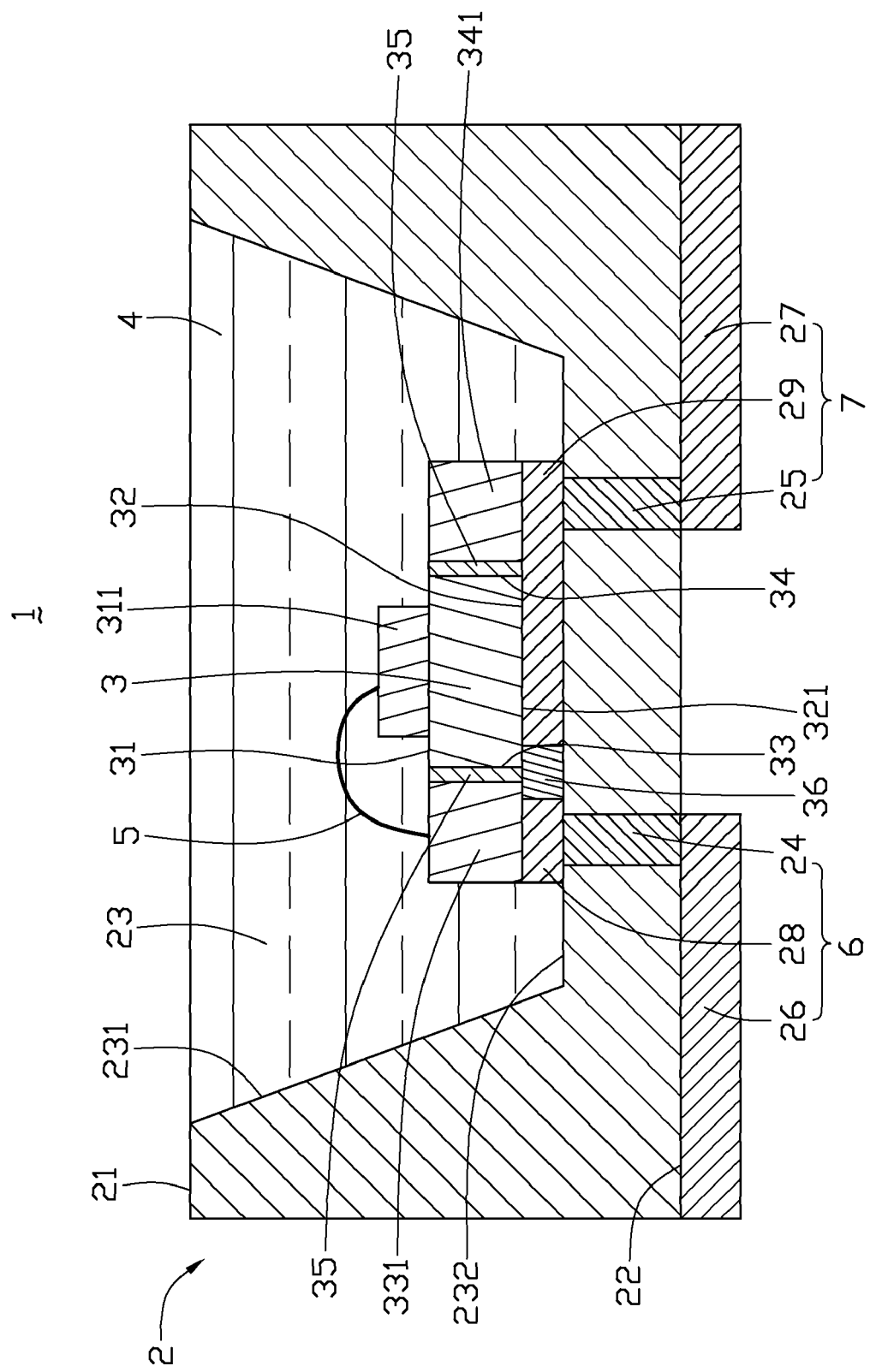
FIG. 1 is a cross-sectional view of an LED according to a first embodiment.

Referring to FIG. 1, a light emitting diode (LED) 1 includes an electrically insulating base 2, a first conductive member 6, a second conductive member 7, an LED chip 3, and an encapsulation material 4. The conductive members 6, 7 are both electrically and thermally conductive.

The base 2 includes an upper surface 21 and a bottom surface 22 opposite to the upper surface 21. A receiving recess 23 is depressed from the upper surface 21 of the base 2. An opening is thus defined through the upper surface 21 of the base 2. The receiving recess 23 is cup-shaped and converges downwardly along an axial direction of the LED 1. The receiving recess 23 has a depth less than a height of the base 2. Accordingly, the base 2 forms a mounting surface 232 at a bottom side of the receiving recess 23. A reflecting surface 231 is formed in the base 2 between the opening and the mounting surface 232, and surrounds the receiving recess 23. The reflecting surface 231 is sectorial in an unfurled view. A layer of material of high reflectivity, such as mercury, can be coated on the reflecting surface 231 of the base 2.

The LED chip 3 is received in the receiving recess 23 and mounted on the mounting surface 232 of the base 2. The encapsulation material 4 is filled in the receiving recess 23 of the base 2 for encapsulating the LED chip 3. The encapsulation material 4 is light transparent material, such as glass, epoxy, resin, or other. Thus light emitted from the LED chip 3 can be reflected by the reflecting surface 231 to an outside of the LED 1 via the encapsulation material 4. The LED chip 3 includes an upper surface 31 confronting the opening of the base 2, a bottom surface 32 opposite to the upper surface 31 and facing the mounting surface 232, a first sidewall 33 and a second sidewall 34 opposite and parallel to the first sidewall 33. The first sidewall 33 and the second sidewall 34 interconnect the upper surface 31 and the bottom surface 32 at left and right sides of the LED chip 3, respectively. The LED chip 3 has a first electrode 311 and a second electrode 321 respectively formed on the upper surface 31 and the bottom surface 32 of the LED chip 3. Two electrically insulating films 35 are respectively formed on the first sidewall 33 and the second sidewall 34 through plasma enhanced chemical vapor deposition (PEVCD). The insulating film 35 is made of silicon dioxide or silicon nitride.

Two thin films made of metal are respectively formed on the two insulating films 35 through chemical vapor deposition. And then two layers made of metal are formed on the two thin films through electroplating. Accordingly, a first heat dissipating layer 331 and a second heat dissipating layer 341 are respectively formed on the two insulating films 35. The first heat dissipating layer 331 and the second heat dissipating layer 341 are made of an electrically conductive material and have a high thermal conductivity, for example copper and aluminum. The first electrode 311 of the LED chip 3 is in electrical connection with the first heat dissipating layer 331 by a gold wire 5.

The first conductive member 6 contacts with the first heat dissipating layer 331 directly, and thus is electrically connected to the first electrode 311 of the LED chip 3 via the first heat dissipating layer 331. The first conductive member 6 includes a first inner electrode 28, a first conductive pole 24 and a first outer electrode 26. The second conductive member 7 is directly connected to the second electrode 321 of the LED chip 3. The second conductive member 7 includes a second inner electrode 29, a second conductive pole 25 and a second outer electrode 27. The first inner electrode 28 and the second inner electrode 29 are formed on the mounting surface 232, and spaced from each other. The first inner electrode 28 is located under the first heat dissipating layer 331, and the second inner electrode 29 is located under the LED chip 3 and the second heat dissipating layer 341. An electrically insulating layer 36 is located between the first inner electrode 28 and the second inner electrode 29 for electrically insulating the first and second inner electrodes 28, 29 of the first and second conductive members 6, 7.

The first outer electrode 26 and the second outer electrode 27 are formed on the bottom surface 22 of the base 2, and spaced from each other. The first conductive pole 24 and the second conductive pole 25 extend through the base 2 from the mounting surface 232 to the bottom surface 22. The first conductive pole 24 and the second conductive pole 25 can be formed as through-holes in the base 2 that are filled with electrically and thermally conductive material, such as metal. The first inner electrode 28 and the first outer electrode 26 are respectively located on two ends of the first conductive pole 24 and are electrically connected by the first conductive pole 24. The second inner electrode 29 and the second outer electrode 27 are respectively located on two ends of the second conductive pole 25 and are electrically connected by the second conductive pole 25.

During operation, the first and second outer electrodes 26, 27 of the first and second conductive members 6, 7 are electrically connected to a power source (not shown) to cause the LED chip 3 to emit light through the upper surface 31 and generate heat. As described above, the bottom surface 32 of the LED chip 3 is attached to the second inner electrode 29, and the sidewalls 33, 34 of the LED chip 3 are coated with the heat dissipating layers 331, 341; thus, the heat of the LED chip 3 can be transferred not only from the bottom surface 32 of the LED chip 3 to the base 2 through the second inner electrode 321 for dissipation, but also can be transferred from the first sidewall 33 to the base 2 through the first heat dissipating layer 331 and the first inner electrode 28 and the first conductive pole 24 of the first conductive member 6, and from the second sidewall 34 to the base 2 through the second heat dissipating layer 341 and the second inner electrode 29 and the second conductive pole 25 of the second conductive member 7. Accordingly, a heat exchange area between the LED chip 3 and the base 2 is increased, which improves the heat dissipating effectiveness of the LED chip 3.

Figure 2:
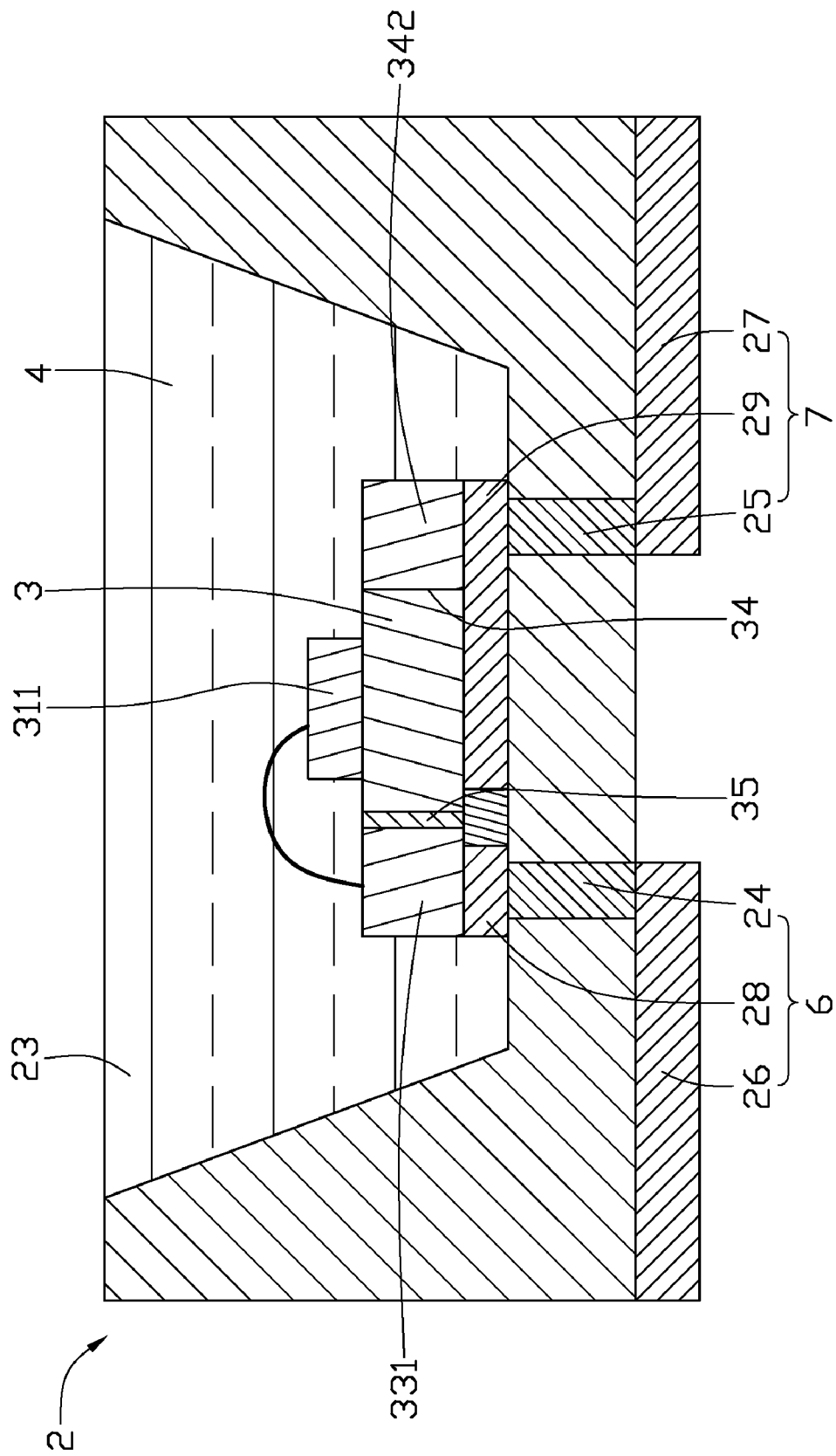
FIG. 2 is a cross-sectional view of an LED according to a second embodiment.

FIG. 2 shows an alternative embodiment. The difference of this embodiment over the previous embodiment is as follows. The second heat dissipating layer 342 is made of a material, for example, ceramic material, which is electrically insulating and has a high thermal conductivity. The second heat dissipating layer 342 is directly attached to the second sidewall 34 through adhesive bonding.

It will be obvious that, within the scope of the invention, many variations are possible to those skilled in the art. The scope of protection of the invention is not limited to the example given herein.

What is claimed is:

1. A light emitting diode comprising:
    a base;
    a first electrically and thermally conductive member extending through the base;
    a second electrically and thermally conductive member extending through the base; and
    a light emitting diode chip being mounted on the base, the light emitting diode chip comprising an upper surface for emitting light, a bottom surface, a first sidewall and a second sidewall, the first and second sidewalls interconnecting the upper surface and bottom surface, a first heat dissipating layer being located on the first sidewall, a second heat dissipating layer being located on the second sidewall, the first heat dissipating layer connecting with the first conductive member for transferring heat of the light emitting diode chip from the first sidewall of the light emitting diode chip to the base, the second heat dissipating layer connecting with the second conductive member for transferring heat of the light emitting diode chip from the second sidewall of the light emitting diode chip to the base.

2. The light emitting diode as claimed in claim 1, wherein the first heat dissipating layer is electrically conductive, an electrically insulating film is located between the first heat dissipating layer and the first sidewall, the light emitting diode chip comprises a first electrode, and the first electrode is electrically connected to the first heat dissipating layer via a gold wire.

3. The light emitting diode as claimed in claim 2, wherein the second heat dissipating layer is electrically conductive, and an electrically insulating film is located between the second heat dissipating layer and the second sidewall.

4. The light emitting diode as claimed in claim 2, wherein the second heat dissipating layer is electrically insulating and attaches to the second sidewall directly.

5. The light emitting diode as claimed in claim 2, wherein the first conductive member comprises a first inner electrode, a first conductive pole and a first outer electrode, and the second conductive member comprises a second inner electrode, a second conductive pole and a second outer electrode, the first conductive pole and the second conductive pole extending through the base, the first inner and outer electrodes located at two opposite sides of the first conductive pole, the second inner and outer electrodes located at two opposite sides of the second conductive pole, the first inner electrode contacting with the first heat dissipating layer, and the second inner electrode contacting with the second heat dissipating layer.

6. The light emitting diode as claimed in claim 5, wherein a second electrode is formed on the bottom surface of the light emitting diode chip, and the second electrode connects with the second inner electrode.

7. The light emitting diode as claimed in claim 6, wherein the first and second inner electrodes are spaced from each other, and an electrically insulating layer is arranged between the first and the second inner electrodes.

8. The light emitting diode as claimed in claim 1, wherein the base comprising an upper surface and a bottom surface, a receiving recess is defined in the upper surface of the base, and the light emitting diode is received in the receiving recess.

9. The light emitting diode as claimed in claim 8, wherein the receiving recess is cup-shaped and converges downwardly along an axial direction of the light emitting diode.

10. The light emitting diode as claimed in claim 9, wherein the receiving recess is filled with encapsulating material made of one of transparent glass, epoxy and resin.

11. The light emitting diode as claimed in claim 10, wherein the base has a reflecting surface coated with a reflective material and surrounding the receiving recess.

* * * * *